United States Patent
Allen et al.

(10) Patent No.: US 8,968,536 B2
(45) Date of Patent: Mar. 3, 2015

(54) SPUTTERING TARGET HAVING INCREASED LIFE AND SPUTTERING UNIFORMITY

(75) Inventors: Adolph Miller Allen, Oakland, CA (US); Ki Hwan Yoon, San Jose, CA (US); Ted Guo, Palo Alto, CA (US); Hong S. Yang, Pleasanton, CA (US); Sang-Ho Yu, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 1667 days.

(21) Appl. No.: 11/764,772

(22) Filed: Jun. 18, 2007

(65) Prior Publication Data

US 2008/0308416 A1    Dec. 18, 2008

(51) Int. Cl.
  *C23C 14/35* (2006.01)
  *C23C 14/34* (2006.01)
  *H01J 37/34* (2006.01)

(52) U.S. Cl.
  CPC ......... *C23C 14/3407* (2013.01); *H01J 37/3423* (2013.01); *H01J 37/3435* (2013.01)
  USPC ............ 204/298.12; 204/298.13; 204/298.19; 204/298.2

(58) Field of Classification Search
  CPC .............. H01J 37/3408; H01J 37/3417; H01J 37/3423; H01J 37/3435; C23C 14/3407
  USPC ................ 204/298.12, 298.13, 298.19, 298.2
  See application file for complete search history.

(56) References Cited

U.S. PATENT DOCUMENTS

| | | | |
|---|---|---|---|
| 3,716,462 A | | 2/1973 | Jensen |
| 3,725,220 A | | 4/1973 | Kessler et al. |
| 4,374,722 A | | 2/1983 | Zega |
| 4,415,421 A | | 11/1983 | Sasanuma |
| 4,430,173 A | | 2/1984 | Boudot |
| 4,505,947 A | | 3/1985 | Vukanovic et al. |
| 4,545,882 A | | 10/1985 | Kelvey |
| 4,606,802 A | | 8/1986 | Kobayashi et al. |
| 4,631,106 A | * | 12/1986 | Nakazato et al. ........ 156/345.46 |
| 4,905,886 A | | 3/1990 | Kennedy et al. |
| 4,924,436 A | | 5/1990 | Strand |
| 4,983,269 A | | 1/1991 | Wegmann |
| 4,995,958 A | | 2/1991 | Anderson et al. |
| 5,041,194 A | | 8/1991 | Mori et al. |
| 5,066,381 A | * | 11/1991 | Ohta et al. ............... 204/298.12 |
| 5,166,758 A | | 11/1992 | Ovshinsky et al. |
| 5,215,639 A | * | 6/1993 | Boys ........................ 204/192.12 |
| 5,314,597 A | | 5/1994 | Harra |
| 5,336,386 A | * | 8/1994 | Marx et al. ............... 204/298.12 |
| 5,342,496 A | | 8/1994 | Stellrecht |
| 5,407,551 A | | 4/1995 | Sieck et al. |

(Continued)

FOREIGN PATENT DOCUMENTS

| CN | 1606795 A | 4/2005 |
|---|---|---|
| CN | 1726301 A | 1/2006 |

(Continued)

*Primary Examiner* — Rodney McDonald
(74) *Attorney, Agent, or Firm* — Ashok K. Janah; Janah & Associates, P.C.

(57) ABSTRACT

A sputtering target for a sputtering chamber comprises a backing plate with a sputtering plate mounted thereon. In one version, the backing plate comprises a circular plate having a front surface comprising an annular groove. The sputtering plate comprises a disk comprising a sputtering surface and a backside surface having a circular ridge that is shaped and sized to fit into the annular groove of the backing plate.

35 Claims, 6 Drawing Sheets

(56) References Cited

U.S. PATENT DOCUMENTS

| | | | |
|---|---|---|---|
| 5,409,590 A | 4/1995 | Hurwitt et al. | |
| 5,415,754 A * | 5/1995 | Manley | 204/192.12 |
| 5,433,835 A | 7/1995 | Demaray et al. | |
| 5,435,965 A | 7/1995 | Mashima et al. | |
| 5,458,759 A | 10/1995 | Hosokawa et al. | |
| 5,487,822 A | 1/1996 | Demaray et al. | |
| 5,487,823 A | 1/1996 | Sawada et al. | |
| 5,490,913 A | 2/1996 | Schertler et al. | |
| 5,538,603 A | 7/1996 | Guo | |
| 5,565,071 A | 10/1996 | Demaray et al. | |
| 5,595,337 A | 1/1997 | Demaray et al. | |
| 5,595,938 A | 1/1997 | Miyazaki | |
| 5,643,422 A | 7/1997 | Yamada | |
| 5,685,959 A | 11/1997 | Bourez et al. | |
| 5,693,203 A | 12/1997 | Ohhashi et al. | |
| 5,695,825 A | 12/1997 | Scruggs | |
| 5,714,768 A | 2/1998 | Ovshinsky et al. | |
| 5,772,858 A | 6/1998 | Tepman | |
| 5,789,717 A | 8/1998 | Imaizumi et al. | |
| 5,798,029 A | 8/1998 | Morita | |
| 5,799,860 A | 9/1998 | Demaray et al. | |
| 5,803,342 A | 9/1998 | Kardokus | |
| 5,830,327 A | 11/1998 | Kolenkow | |
| 5,876,573 A | 3/1999 | Moslehi et al. | |
| 5,876,576 A * | 3/1999 | Fu | 204/298.2 |
| 5,879,524 A | 3/1999 | Hurwitt et al. | |
| 5,887,481 A | 3/1999 | Leroy et al. | |
| 5,914,018 A | 6/1999 | Fu et al. | |
| 5,919,345 A | 7/1999 | Tepman | |
| 5,942,089 A | 8/1999 | Sproul et al. | |
| 5,963,778 A | 10/1999 | Stellrecht | |
| 6,001,426 A | 12/1999 | Witherspoon et al. | |
| 6,010,583 A | 1/2000 | Annavarapu et al. | |
| 6,024,852 A | 2/2000 | Tamura et al. | |
| 6,040,545 A | 3/2000 | Taki et al. | |
| 6,042,706 A | 3/2000 | Fu | |
| 6,059,945 A | 5/2000 | Fu et al. | |
| 6,071,323 A | 6/2000 | Kawaguchi | |
| 6,071,389 A | 6/2000 | Zhang | |
| 6,073,830 A | 6/2000 | Hunt et al. | |
| 6,086,735 A | 7/2000 | Gilman et al. | |
| 6,139,701 A | 10/2000 | Pavate et al. | |
| 6,146,509 A | 11/2000 | Aragon | |
| 6,149,776 A | 11/2000 | Tang et al. | |
| 6,179,973 B1 | 1/2001 | Lai et al. | |
| 6,183,614 B1 | 2/2001 | Fu | |
| 6,183,686 B1 | 2/2001 | Bardus et al. | |
| 6,187,682 B1 | 2/2001 | Denning et al. | |
| 6,190,516 B1 | 2/2001 | Xiong et al. | |
| 6,199,259 B1 | 3/2001 | Demaray et al. | |
| 6,221,217 B1 | 4/2001 | Moslehi et al. | |
| 6,227,435 B1 | 5/2001 | Lazarz et al. | |
| 6,231,725 B1 | 5/2001 | Nulman et al. | |
| 6,238,528 B1 | 5/2001 | Xu et al. | |
| 6,244,121 B1 | 6/2001 | Hunter | |
| 6,251,242 B1 | 6/2001 | Fu et al. | |
| 6,267,851 B1 | 7/2001 | Hosokawa | |
| 6,274,008 B1 | 8/2001 | Gopalraja et al. | |
| 6,277,249 B1 | 8/2001 | Gopalraja et al. | |
| 6,277,263 B1 | 8/2001 | Chen | |
| 6,283,357 B1 | 9/2001 | Kulkarni et al. | |
| 6,287,437 B1 | 9/2001 | Pandhumsoporn et al. | |
| 6,299,740 B1 | 10/2001 | Hieronymi et al. | |
| 6,309,556 B1 | 10/2001 | Joyce et al. | |
| 6,337,151 B1 | 1/2002 | Uzoh et al. | |
| 6,337,453 B1 | 1/2002 | Miller et al. | |
| 6,338,781 B1 | 1/2002 | Sichmann et al. | |
| 6,340,415 B1 | 1/2002 | Raaijmakers et al. | |
| 6,344,114 B1 | 2/2002 | Sichmann et al. | |
| 6,346,177 B2 | 2/2002 | Leiphart | |
| 6,365,010 B1 | 4/2002 | Hollars | |
| 6,372,098 B1 * | 4/2002 | Newcomb et al. | 204/192.12 |
| 6,406,599 B1 | 6/2002 | Subramani et al. | |
| 6,409,965 B1 | 6/2002 | Nagata et al. | |
| 6,413,382 B1 | 7/2002 | Wang et al. | |
| 6,413,387 B1 | 7/2002 | Shi et al. | |
| 6,413,858 B1 | 7/2002 | Chopra | |
| 6,416,634 B1 | 7/2002 | Mostovoy et al. | |
| 6,419,806 B1 | 7/2002 | Holcomb et al. | |
| 6,436,251 B2 | 8/2002 | Gopalraja et al. | |
| 6,437,383 B1 | 8/2002 | Xu | |
| 6,440,221 B2 | 8/2002 | Shamouilian et al. | |
| 6,444,104 B2 | 9/2002 | Gopalraja et al. | |
| 6,451,177 B1 | 9/2002 | Gopalraja et al. | |
| 6,454,919 B1 | 9/2002 | Sundarrahan et al. | |
| 6,464,889 B1 | 10/2002 | Lee et al. | |
| 6,475,854 B2 | 11/2002 | Narwankar et al. | |
| 6,482,302 B1 | 11/2002 | Li et al. | |
| 6,487,910 B1 | 12/2002 | Leybovich | |
| 6,491,801 B1 | 12/2002 | Gung | |
| 6,494,098 B1 | 12/2002 | Leybovich | |
| 6,495,009 B1 | 12/2002 | Gung | |
| 6,497,797 B1 | 12/2002 | Kim | |
| 6,500,321 B1 | 12/2002 | Ashtiani et al. | |
| 6,507,061 B1 | 1/2003 | Hudgens et al. | |
| 6,518,086 B2 | 2/2003 | Beck et al. | |
| 6,537,428 B1 | 3/2003 | Xiong et al. | |
| 6,579,431 B1 | 6/2003 | Bolcavage et al. | |
| 6,599,405 B2 | 7/2003 | Hunt et al. | |
| 6,610,184 B2 | 8/2003 | Ding et al. | |
| 6,610,959 B2 | 8/2003 | Carlson et al. | |
| 6,619,537 B2 | 9/2003 | Zhang et al. | |
| 6,620,296 B2 * | 9/2003 | Gogh et al. | 204/192.1 |
| 6,623,610 B1 | 9/2003 | Onishi | |
| 6,627,050 B2 | 9/2003 | Miller et al. | |
| 6,635,219 B2 | 10/2003 | Wen et al. | |
| 6,652,668 B1 | 11/2003 | Perry et al. | |
| 6,677,254 B2 | 1/2004 | Narwankar et al. | |
| 6,699,375 B1 | 3/2004 | Crocker | |
| 6,708,870 B2 | 3/2004 | Koenigsmann et al. | |
| 6,709,557 B1 | 3/2004 | Kailasam et al. | |
| 6,716,321 B2 | 4/2004 | Gilmore et al. | |
| 6,730,196 B2 | 5/2004 | Wang et al. | |
| 6,739,196 B2 | 5/2004 | Leybovich | |
| 6,743,342 B2 | 6/2004 | Wang | |
| 6,749,103 B1 | 6/2004 | Ivanov et al. | |
| 6,750,156 B2 | 6/2004 | Le et al. | |
| 6,759,267 B2 | 7/2004 | Chen | |
| 6,776,879 B2 | 8/2004 | Yamamoto et al. | |
| 6,797,362 B2 | 9/2004 | Parfeniuk et al. | |
| 6,811,657 B2 | 11/2004 | Jaso | |
| 6,824,652 B2 | 11/2004 | Park | |
| 6,840,427 B2 | 1/2005 | Ivanov | |
| 6,841,050 B2 | 1/2005 | Hong et al. | |
| 6,848,608 B2 | 2/2005 | Wickersham | |
| 6,852,202 B2 | 2/2005 | Miller et al. | |
| 6,858,116 B2 | 2/2005 | Okabe et al. | |
| 6,858,277 B1 | 2/2005 | Yamada et al. | |
| 6,872,284 B2 | 3/2005 | Ivanov et al. | |
| 6,875,321 B2 | 4/2005 | Ding et al. | |
| 6,887,356 B2 | 5/2005 | Ford et al. | |
| 6,916,407 B2 | 7/2005 | Voser et al. | |
| 6,946,408 B2 | 9/2005 | Le et al. | |
| 6,955,852 B2 | 10/2005 | Ivanov | |
| 6,992,261 B2 | 1/2006 | Kachalov et al. | |
| 7,037,762 B2 | 5/2006 | Joo et al. | |
| 7,063,773 B2 | 6/2006 | Ivanov et al. | |
| 7,115,193 B2 | 10/2006 | Takahashi | |
| 7,115,927 B2 | 10/2006 | Hideki et al. | |
| 7,131,883 B2 | 11/2006 | Park et al. | |
| 7,146,703 B2 | 12/2006 | Ivanov | |
| 7,175,802 B2 | 2/2007 | Sandlin et al. | |
| 7,297,247 B2 | 11/2007 | Subramani et al. | |
| 7,316,199 B2 | 1/2008 | Horioka et al. | |
| 7,316,763 B2 | 1/2008 | Hosokawa et al. | |
| 7,331,250 B2 | 2/2008 | Hunter | |
| 7,335,282 B2 | 2/2008 | Fu et al. | |
| 7,374,636 B2 | 5/2008 | Horioka et al. | |
| 7,422,654 B2 | 9/2008 | Lindley et al. | |
| 7,458,335 B1 | 12/2008 | Bjorkman | |
| 7,467,741 B2 | 12/2008 | Wickersham, Jr. et al. | |
| 7,476,289 B2 | 1/2009 | White | |
| 7,504,006 B2 | 3/2009 | Gopalraja et al. | |
| 7,504,008 B2 | 3/2009 | Doan et al. | |

(56) References Cited

U.S. PATENT DOCUMENTS

| | | | |
|---|---|---|---|
| 7,550,055 B2 | 6/2009 | Le et al. |
| 7,550,066 B2 | 6/2009 | Tepman |
| 7,588,668 B2 | 9/2009 | Ye et al. |
| 7,618,521 B2 | 11/2009 | Fu |
| 7,644,745 B2 | 1/2010 | Le et al. |
| 2001/0030172 A1 | 10/2001 | Takahashi et al. |
| 2001/0035237 A1 | 11/2001 | Nagano et al. |
| 2001/0035238 A1 | 11/2001 | Nagano et al. |
| 2001/0045353 A1 | 11/2001 | Hieronymi et al. |
| 2002/0014289 A1 | 2/2002 | Nagano et al. |
| 2002/0033330 A1 | 3/2002 | Demaray et al. |
| 2002/0075631 A1 | 6/2002 | Singh et al. |
| 2002/0081804 A1 | 6/2002 | Gill et al. |
| 2002/0083571 A1 | 7/2002 | Lee et al. |
| 2002/0100680 A1 | 8/2002 | Yamamoto et al. |
| 2002/0112955 A1 | 8/2002 | Aimone et al. |
| 2003/0035906 A1 | 2/2003 | Memarian et al. |
| 2003/0077199 A1 | 4/2003 | Sandlin et al. |
| 2003/0102207 A1 | 6/2003 | Wu et al. |
| 2003/0124748 A1 | 7/2003 | Summerfelt et al. |
| 2003/0127319 A1 | 7/2003 | Demaray et al. |
| 2003/0175142 A1 | 9/2003 | Milonopoulou et al. |
| 2003/0183506 A1 * | 10/2003 | Ivanov et al. ............ 204/192.13 |
| 2003/0218054 A1 | 11/2003 | Koenigsmann et al. |
| 2004/0016635 A1 | 1/2004 | Ford et al. |
| 2004/0020769 A1 | 2/2004 | Ivanov et al. |
| 2004/0035698 A1 | 2/2004 | Ivanov et al. |
| 2004/0056070 A1 | 3/2004 | Ivanov |
| 2004/0079634 A1 | 4/2004 | Wickersham et al. |
| 2004/0089542 A1 | 5/2004 | Liu et al. |
| 2004/0113364 A1 | 6/2004 | Ivanov |
| 2004/0115945 A1 | 6/2004 | Lowrey et al. |
| 2004/0144638 A1 | 7/2004 | Jaso |
| 2004/0165422 A1 | 8/2004 | Hideki et al. |
| 2004/0222088 A1 | 11/2004 | Subramani et al. |
| 2004/0256226 A1 | 12/2004 | Wickersham |
| 2005/0002227 A1 | 1/2005 | Hideki et al. |
| 2005/0011749 A1 | 1/2005 | Kachalov et al. |
| 2005/0029094 A1 | 2/2005 | Watanabe et al. |
| 2005/0029502 A1 | 2/2005 | Hudgens |
| 2005/0061857 A1 | 3/2005 | Hunt et al. |
| 2005/0067469 A1 | 3/2005 | Facey et al. |
| 2005/0072668 A1 | 4/2005 | Kennedy et al. |
| 2005/0089699 A1 | 4/2005 | Lin et al. |
| 2005/0092604 A1 | 5/2005 | Ivanov |
| 2005/0147150 A1 | 7/2005 | Wickersham et al. |
| 2005/0161322 A1 | 7/2005 | Smathers |
| 2005/0178653 A1 | 8/2005 | Fisher |
| 2006/0021870 A1 | 2/2006 | Tsai et al. |
| 2006/0070876 A1 | 4/2006 | Wu et al. |
| 2006/0076230 A1 * | 4/2006 | Murphy et al. ........... 204/192.12 |
| 2006/0081459 A1 | 4/2006 | Tsai et al. |
| 2006/0099126 A1 | 5/2006 | Hosono et al. |
| 2006/0105182 A1 | 5/2006 | Brueckner et al. |
| 2006/0108217 A1 | 5/2006 | Krempel-Hesse et al. |
| 2006/0188742 A1 | 8/2006 | West et al. |
| 2006/0266639 A1 | 11/2006 | Le et al. |
| 2006/0283703 A1 | 12/2006 | Lee et al. |
| 2006/0289305 A1 | 12/2006 | White |
| 2007/0056845 A1 | 3/2007 | Ye et al. |
| 2007/0102286 A1 | 5/2007 | Scheible et al. |
| 2007/0125646 A1 | 6/2007 | Young et al. |
| 2007/0170052 A1 | 7/2007 | Ritchie et al. |
| 2007/0173059 A1 | 7/2007 | Young et al. |
| 2007/0215463 A1 | 9/2007 | Parkhe |
| 2007/0246346 A1 | 10/2007 | Subramani et al. |
| 2008/0308416 A1 | 12/2008 | Allen et al. |
| 2009/0090620 A1 | 4/2009 | Pavloff |
| 2009/0107834 A1 | 4/2009 | Ye et al. |
| 2009/0114528 A1 | 5/2009 | Lindenberg et al. |
| 2009/0178919 A1 | 7/2009 | Lopp et al. |
| 2009/0272641 A1 | 11/2009 | Mueller et al. |

FOREIGN PATENT DOCUMENTS

| | | |
|---|---|---|
| EP | 1350861 | 10/2003 |
| GB | 2049737 | 12/1980 |
| GB | 2155495 | 9/1985 |
| JP | 58-147558 | 9/1983 |
| JP | 59 232271 A | 12/1984 |
| JP | 59232271 A | 12/1984 |
| JP | 63235471 A | 9/1988 |
| JP | 63290270 | 11/1988 |
| JP | 1283367 | 11/1989 |
| JP | 06140330 A | 10/1992 |
| JP | 06 140330 A | 5/1994 |
| JP | 07224377 | 8/1995 |
| JP | 09111452 | 4/1997 |
| JP | 11-106904 | 4/1999 |
| JP | 2000265265 | 9/2000 |
| JP | 2002-060935 | 2/2002 |
| JP | 2004-132725 | 4/2004 |
| WO | WO-01/39250 | 5/2001 |
| WO | WO-03/043052 A1 | 5/2003 |
| WO | WO-03062491 | 7/2003 |
| WO | WO 03/106733 A1 * | 12/2003 |
| WO | WO-04-001094 | 12/2003 |
| WO | WO-2004-002979 | 3/2004 |
| WO | WO-2004/033748 | 4/2004 |
| WO | WO-2004/038062 A2 | 5/2004 |
| WO | WO-2006/078709 | 7/2006 |
| WO | WO-2007037796 | 4/2007 |
| WO | WO-2008/156794 | 12/2008 |
| WO | WO-2008/156794 A3 | 3/2009 |

* cited by examiner

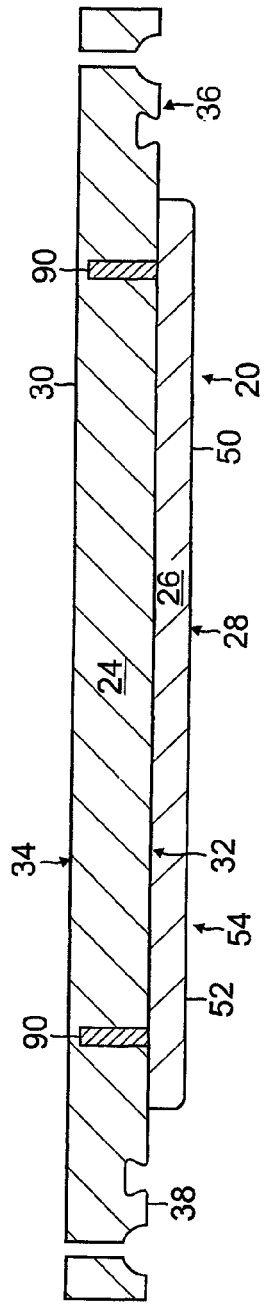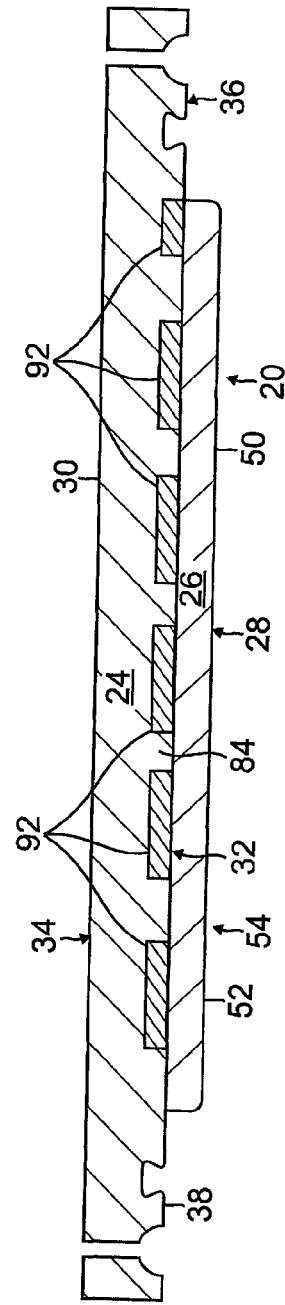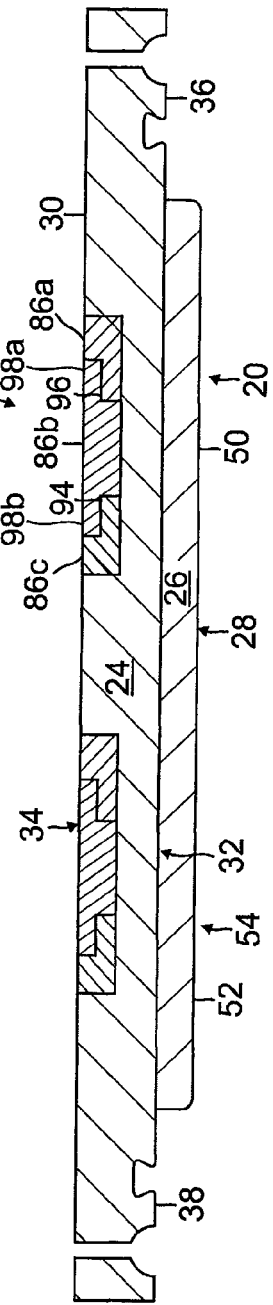

SPUTTERING TARGET HAVING INCREASED LIFE AND SPUTTERING UNIFORMITY

BACKGROUND

Embodiments of the present invention relate to a sputtering target for sputtering process chambers.

A sputtering chamber is used to sputter deposit material onto a substrate in the fabrication of integrated circuits and displays. Typically, the sputtering chamber comprises an enclosure around a sputtering target facing a substrate support, a process zone into which a process gas is introduced, a gas energizer to energize the process gas, and an exhaust port to exhaust and control the pressure of the process gas in the chamber. The sputtering target is bombarded by energetic ions formed in the energized gas causing material to be knocked off the target and deposited as a film on the substrate. The sputtering chamber can also have a magnetic field generator that shapes and confines a magnetic field about the target to improve sputtering of the target material. The sputtered target material may be a metal, such as for example aluminum, copper, tungsten, titanium, cobalt, nickel or tantalum. Elemental materials may be sputtered with inert gases such as argon or krypton and gases such as nitrogen or oxygen may be used to sputter elemental materials to form compounds such as tantalum nitride, tungsten nitride, titanium nitride or aluminum oxide.

However, in such sputtering processes, some portions of the target can be sputtered at higher sputtering rates than other portions resulting in the target exhibiting an uneven cross-sectional thickness or surface profile after processing a batch of substrates. Such uneven target sputtering can arise from variations in localized plasma density caused by the chamber geometry, the shape of the magnetic field about the target, eddy currents induced in the target, and other factors. Uneven sputtering can also be caused by differences in grain size or the structure of the surface material of the target. For example, it has been found that uneven target sputtering can result in the formation of concentric circular depressions at which material was sputtered from the target at higher rates than from surrounding areas. As the depressions get deeper, the chamber wall and backing plate behind the target become exposed and can be sputtered away resulting in contamination of the substrate with these materials. Also, a target having a variable non-uniform surface profile can result in deposition of uneven thicknesses of sputtered material across the substrate surface. Thus sputtered targets are typically removed from the chamber before any depressions formed on the target become too deep, wide or numerous. As a result, a large portion of the thickness of the sputtering target remains unused because the target has to be removed prematurely from the chamber.

It is desirable to have a sputtering target which can provide uniform sputtering for an extended sputtering time without requiring frequent replacement. It is also desirable to have a target which can be sputtered without excessive risk of erosion through its thickness. It is further desirable to have a sputtering target which provides uniform sputtering properties throughout its life.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 5 is a sectional schematic side view of an embodiment of a target having a backing plate with a band embedded in the backing plate;

FIGS. 6A and 6B is a sectional schematic side view and a sectional schematic top view of an embodiment of a target comprising a spiral plate;

FIGS. 7A and 7B is a sectional schematic side view and a sectional schematic top view of an embodiment of a target comprising a plurality of nesting rings.

DESCRIPTION

Figure 1A:
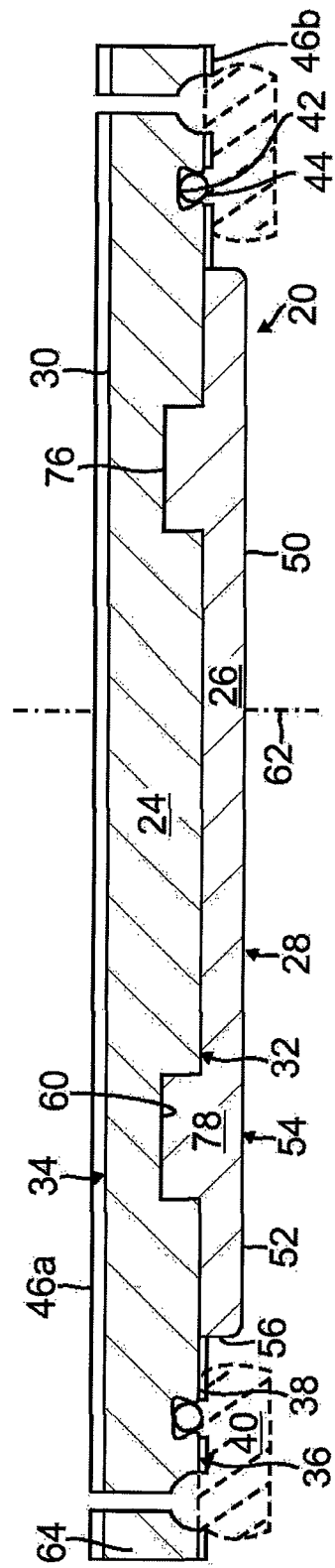
FIG. 1A is a sectional schematic side view of an embodiment of a sputtering target having a backing plate with an annular groove and sputtering plate with a circular ridge that fits into the annular groove of the backing plate.
Figure 1B:
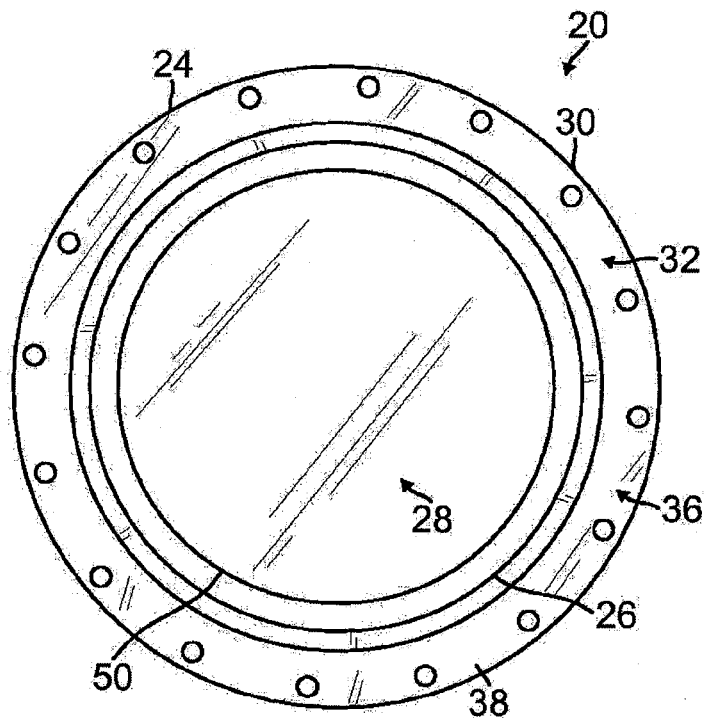
FIG. 1B is a schematic top view of the target of FIG. 1A, showing the sputtering surface of the sputtering plate surrounded by an annular peripheral ledge and O-ring groove of the backing plate.

An illustrative embodiment of a sputtering target 20 that is capable of providing a longer process life, better sputtering uniformity, and reduced contamination caused by erosion grooves, is shown in FIGS. 1A and 1B. The sputtering target 20 comprises a backing plate 24 which serves as a base to support a sputtering plate 26 comprising sputtering material to be sputtered in a sputtering chamber. The sputtering plate 26 comprises a sputtering surface 28 that is positioned to directly face a substrate to provide line-of-sight sputtered species to the substrate. The sputtering plate 26 can be bonded to the backing plate 24 mechanically or by other means such as diffusion bonding. The sputtering target 20 can be circular or rectangular depending on the shape of the substrate that is being processed. Circular shapes are used for circular substrates, such as semiconductor wafers, and rectangular shapes for rectangular substrates such as display panels.

In one version, the backing plate 24 comprises a circular plate 30 having a front surface 32 and a back surface 34. The front surface 32 of the circular plate 30 is shaped and sized to receive the sputtering plate 26. The back surface 34 can be shaped to form an external wall of the chamber or to be mounted on a chamber lid or adapter. The backing plate 24 also has a peripheral ledge 36 that extends beyond the radius of the sputtering plate 26. The peripheral ledge 36 comprises an outer footing 38 that rests on an isolator 40 in a sputtering chamber to electrically isolates the target 20 from chamber sidewalls. The isolator 40 is made from a ceramic material, such as aluminum oxide. The peripheral ledge 36 contains a peripheral O-ring groove 42 into which an O-ring 44 is placed to form a vacuum seal with an external chamber lid/adapter. The backing plate 24 can also have a protective coating 46a,b, for example, a twin-wire arc sprayed aluminum coating, on the backside and front of the peripheral ledge 36, respectively. In one version, the backing plate 24 is made from a metal, such as for example, aluminum, copper, stainless steel, or other alloys thereof, such as copper/chromium or aluminum/copper. In one embodiment, the backing plate comprises a copper chromium alloy, also known as a CuCr alloy.

Figure 8:
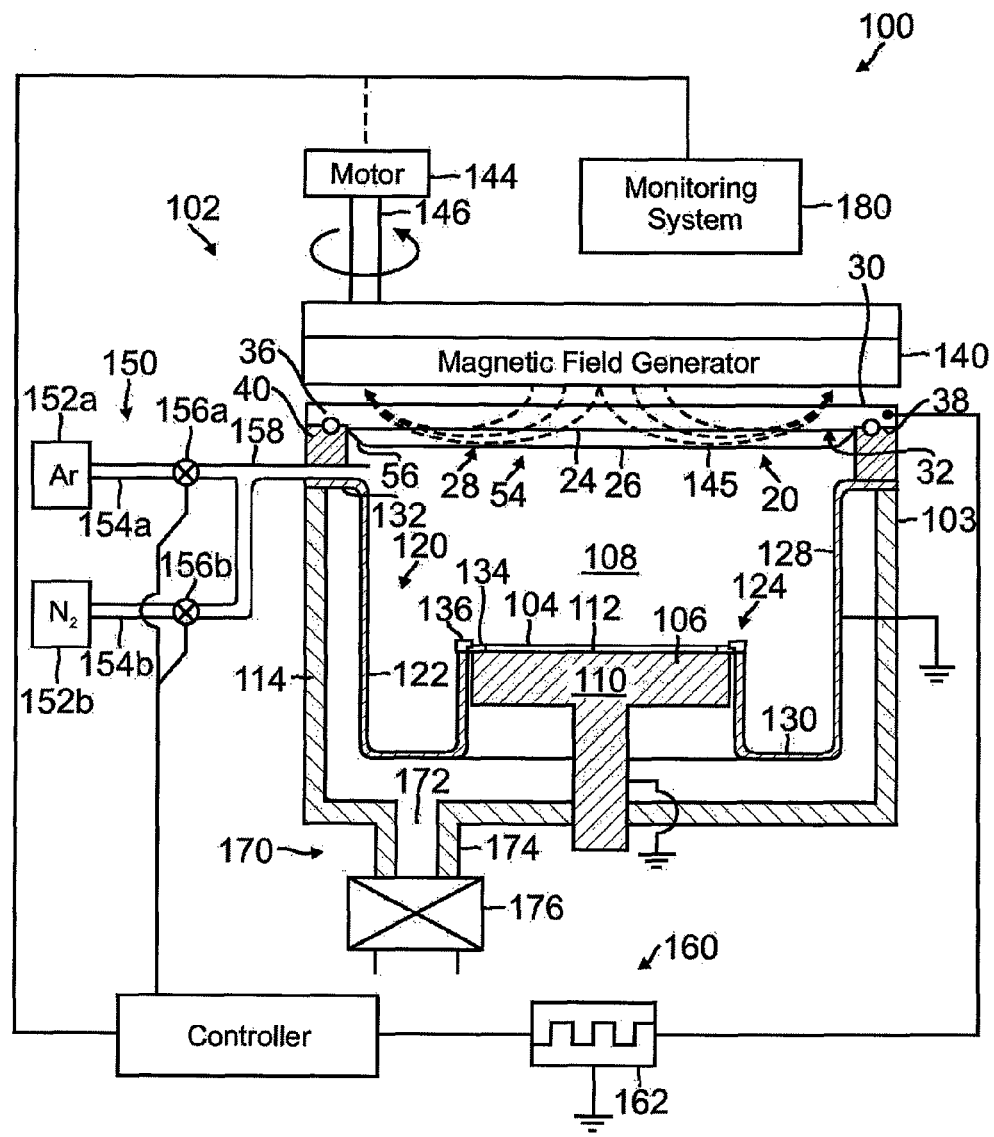
FIG. 8 is a sectional schematic side view of an embodiment of a sputtering chamber for sputtering material onto a substrate using any one of the sputtering targets described herein.

In one version, the sputtering plate 26 is shaped as a disk 50 and mounted on the backing plate 24, the disk 50 being made of the material to be sputtered onto the substrate. Typically, the disk 50 comprises a material that is different from the material of the backing plate 24. For example, the disk 50 can be composed of a metal, such as for example, aluminum, copper, cobalt, molybdenum, nickel, palladium, platinum, tantalum, titanium, or tungsten. The disk 50 comprises a central cylindrical mesa 52 having the sputtering surface 54 that forms a plane that is parallel to the plane of the substrate 104 (FIG. 8). In this version, an inclined rim 56 surrounds the cylindrical mesa 52, and in use, the inclined rim 56 is adjacent to a sidewall or shield of a sputtering chamber to define an area therebetween that forms a convoluted shaped gap which impedes the passage of sputtered plasma species therethrough to reduce the accumulation of sputtered deposits on peripheral chamber surfaces. The disk 50 can have a diameter that corresponds to the diameter of the substrate. In one version, the disk 50 has a diameter of from about 200 mm to about 320 mm; however, the disk can have higher diameters depending on the size of the substrate.

In the version shown in FIG. 1A, the front surface 32 of the circular plate 30 of the backing plate 24 comprises at least one annular groove 60 that is cut into the thickness of the backing plate 24. The annular groove 60 is cut to a depth which does not extend all the way to the backside surface 34 of the backing plate 24. The annular groove 60 also has an axis of symmetry 62 about the center of the circular plate 30 about which the magnetic and electrical fields in the chamber are essentially symmetrical. However, the annular groove 60 can also be asymmetrically shaped if the magnetic or electrical fields in the chamber are asymmetrical or because of nonuniform or asymmetric gas density or composition.

The annular groove 60 is shaped and sized to correspond to an observed region of higher target erosion relative to adjacent target area that is determined experimentally or by modeling. For example, the location and shape of the high erosion regions of a target can be previously determined by mapping the target erosion regions for a plurality of targets (which do not have the current features) that are run through multiple sputtering processes in a chamber at pre-selected process conditions. The shape and size of the annular groove 60 is selected based on the observed erosion grooves. Thus, the shape and size of the annular groove 60 also varies depending on the process conditions and other processing parameters used in the chamber and the geometry of sputtering chamber in which the target 20 is to be mounted. The configuration of the annular groove 60 can also depend upon the target material itself, the shape and symmetry of the energy field applied to sputter material from the target 20, and even the shape of a magnetic field applied across the target 20 during the sputtering process. Thus, the scope of the invention should not be limited to shapes of the annular grooves 60 of the targets 20 shown herein for illustrative purposes.

In one version, the annular groove 60 is a circle that is symmetric about a center of the circular plate 30 and spaced apart from the perimeter 64 of the circular plate 30, as shown in FIG. 1A. In one example, this annular groove 60 comprises a depth of less than about 5 cm, for example, from about 0.3 cm to about 2 cm, such as about 0.5 cm. The width of the annular groove 60 is from about 1 cm to about 7.5 cm. The annular groove 60 also has inner and outer radii, and in one version, the radial distance between the inner and outer radius is from about 1 to about 5 cm. Such an annular groove 60 typically corresponds to and matches the shape of the outer erosion circle formed in a target 20 which is sputtered in a conventional PVD chamber, such as for example the Endura chamber, available from Applied Materials, Inc, Santa Clara, Calif. The process conditions typically include process pressures within the chamber ranging from about 0.5 to 3.5 mT of pressure from Ar or a mixture of Ar/N2 process gasses and deposition powers from of between about 1 kW and about 40 kW.

Optionally, in this version, the backside surface of the disk 50 of the sputtering plate 26 can also have a circular ridge 76 that is shaped and sized to fit within the annular groove 60 of the circular plate 30 of the backing plate 24. The circular ridge 76 has an inner radius and an outer radius that match the inner and outer radius of the annular grooves 60 in the circular plate 30. In use, the circular ridge 76 provides excess sputtering material for sputtering by the sputtering plasma. When the sputtering target 20 is eroded excessively at the regions 78 overlying the circular ridges 76, the sputtering material in the circular ridges 76 provides additional sputtering material for sputtering in the sputtering chamber. In this manner, the circular ridges 76 of additional sputtering material extends the lifetime of the target 20 by allowing continued use of the target 20 even when deep grooves with depths extending to the thickness of the backside surface of the sputtering plate 26 are formed. The circular ridges 76 effectively increase the thickness of the sputtering plate 26 behind the grooved regions to provide excess material which precludes the erosion groove from penetrating the sputtering plate 26 at these regions.

The circular ridge 76 of the sputtering plate 26 can also be used to change the electromagnetic properties of the sputtering target 20 at this region when the circular ridges 76 are formed from a second material that is different than the first material used to form the backing plate 24. The second material is selected to alter the electrical or magnetic properties at these regions to thereby also change the eddy currents at these regions.

Figure 2A:
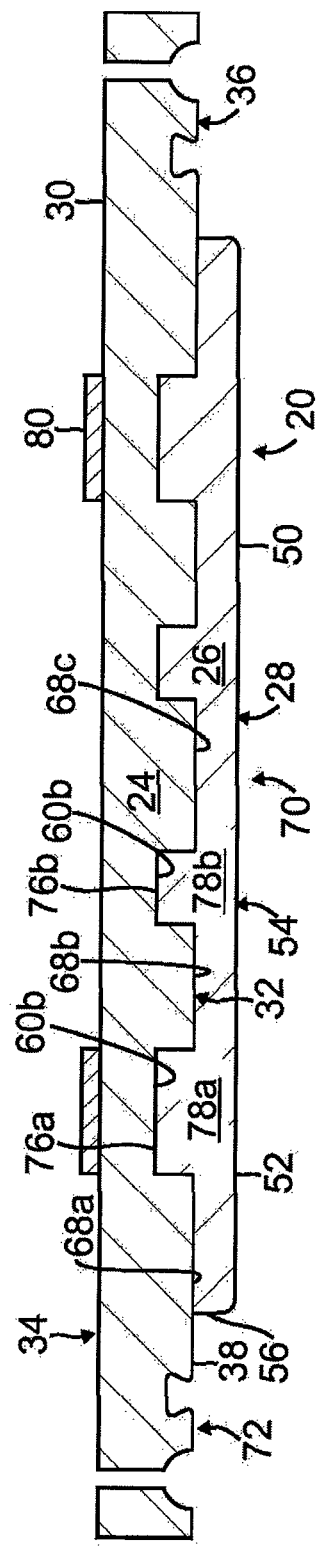
FIG. 2A is a sectional schematic side view of an embodiment of a target having a backing plate with a plurality of annular grooves and sputtering plate having multiple circular ridges that each fit into one of the annular grooves.
Figure 2B:
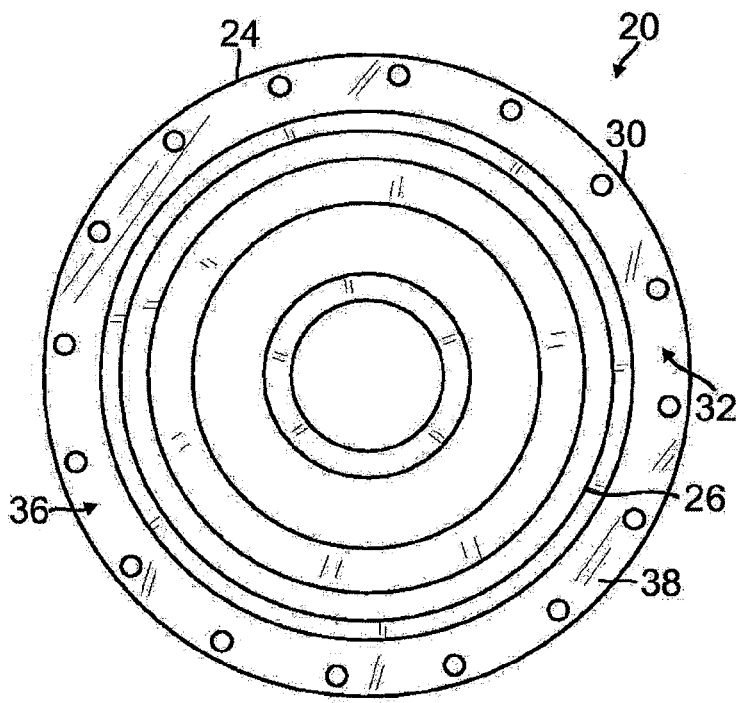
FIG. 2B is a schematic top view of the front surface of the backing plate of the target of FIG. 2A showing the plurality of annular grooves.

In another version, the backing plate 24 comprises a circular plate 30 with a front surface 32 having a plurality of annular grooves 60 which are concentric to one another and centered about the axis 62 of the target 20, as shown in FIGS. 2A and 2B. For example, the circular plate 30 can have annular grooves 60 that number from about 1 to about 6. In the example shown, the circular plate 30 has a radially inner annular groove 60a and a surrounding outer annular groove 60b. The annular grooves 60a,b are separated by circular mesas 68a-c that extend around or are between, each of the annular grooves 60a,b. In addition, in the version shown, the outer annular groove 60a has a larger width than the inner annular groove 60b, as this sputtering target 20 was designed to withstand higher wider erosion grooves at its peripheral region 70 relative to its central region 72.

In this version, the backside surface of the disk 50 also comprises a plurality of circular ridges 76a,b that each correspond to an annular groove 60 of the circular plate 30 of the backing plate 24. The circular ridges 76 provide additional sputtering material which extends the lifetime of the target 20, by effectively increasing the thickness of the sputtering plate 26 at the regions 78a,b which need increased thickness. In addition, the circular ridges 76a,b provide a second material that is different than the first material used to form the backing plate 24 to alter the electrical or magnetic properties at these regions thereby also changing eddy currents at these regions.

In another version, the sputtering target 20 optionally comprises a ring 80 comprising a third material that is mounted to the backside surface 34 of the backing plate 24, as shown in FIG. 2A. The backing plate 24 is made from a first material, the sputtering plate 26 is made of a second material, and the ring 80 is made from a third material that is a different material than the first and second materials. In this version, the ring 80 is attached to the backing plate 24 by an adhesive, diffusion bond, or even formed directly on the plate by electro-deposition. In one version, the ring 80 is mounted to the back surface 34 of the backing plate 24 by solder-bonding and is further sealed by an inert polymeric coating to protect the ring 80 against corrosion.

In one version, the ring 80 is provided to modify the eddy currents passing through the backing plate 24 by selecting a material for the ring 80 that has different electromagnetic characteristics than the material of the backing plate 24. The ring material is chosen to control the magnitude of the eddy current by selecting a material based on its relative magnetic permeability (μ) and the electrical conductivity (σ) of the material. Depending on the application, the ring material can be (i) diamagnetic with a relative permeability that is slightly less than 1 (where 1 denotes the relative permeability of free space) such as for example, silver; (ii) paramagnetic with a relative permeability slightly higher than 1, such as for example aluminum; or (iv) ferromagnetic with a relative permeability that is much larger than 1, such as nickel which has a relative magnetic permeability, μ, of approximately 100; iron with a μ of about 200; steel; iron-nickel-chromium alloy; and "Mu-metal" which has a μ of 20000.

In one version, the backing plate 24 comprises a first material that is CuCr alloy, CuZn alloy, or aluminum; the sputtering plate 26 is made of a second material such as tantalum, titanium, nickel, or aluminum; and the ring 80 is made from a third material comprising nickel, stainless steel, or aluminum. When the ring 80 comprises a ferromagnetic material such as nickel or stainless steel, and the backing plate comprises a paramagnetic material such as aluminum, the ring 80 modifies the eddy currents in the backing plate 24 to increase the eddy current in the plate 24 and thereby create a net lower magnetic field about the sputtering plate 26 which results in less erosion in the region 78a of the sputtering plate 26 which is directly over the ring 80. When the ring 80 comprises a paramagnetic material such as aluminum, the ring 80 modifies the eddy currents in the backing plate 24 to reduce their values, and thereby achieve higher erosion rates in the region 78a of the sputtering plate 26 which is directly over the ring 80. The magnitude of the eddy current in the ring 80 can also be controlled by the selecting the electrical conductivity of the ring material because eddy current is proportional to electrical conductivity.

Another way of modifying the magnetic field about portions of the sputtering target, such as the sputtering plate 26, is to make the ring 80 of a material having an electrically conductivity that is different than the electrical conductivity of the material of the backing plate 24. For example, a ring 80 comprising copper (which has a conductivity of 5.95 μOhm-cm) will have a higher conductivity, and consequently a higher eddy current, than a backing plate 24 of aluminum (which has a conductivity of 3.7 μOhm-cm). This generates higher eddy currents in the ring 80 (relative to a ring 80 made from a lower conductivity material or no ring at all) which would cause a stronger magnetic field about portions of the target 20, resulting in controllably higher erosion rates at those portions.

Figure 3:
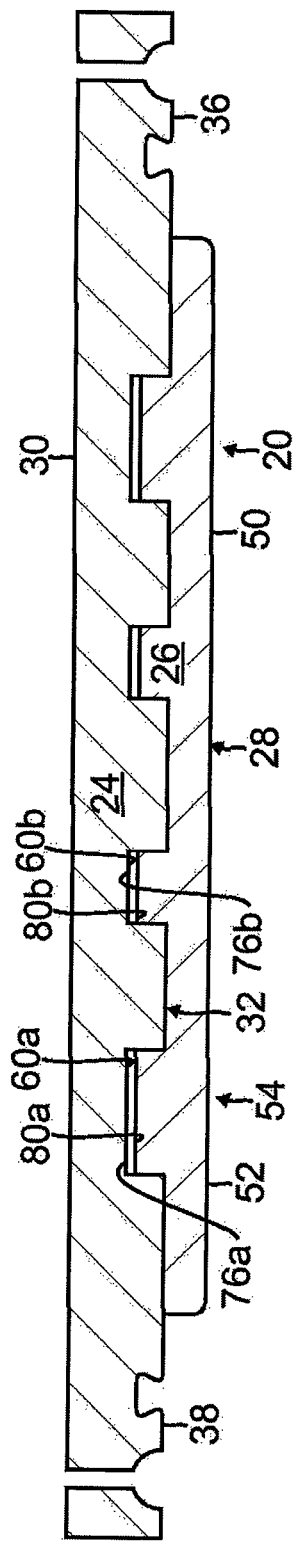
FIG. 3 is a sectional schematic side view of an embodiment of a target having a plurality of rings positioned between the backing plate and the sputtering plate.

In another version, as shown in FIG. 3, a plurality of rings 80a,b comprising a third material is attached to the grooves 60a,b of the circular plate 30 of the backing plate 24 to modify the eddy currents passing through the backing plate 24. The rings 80a,b can rest in the annular grooves 60a,b without being attached to the grooves or can be bonded to the annular grooves. In one version, the rings 80a,b are attached within the annular grooves 60a,b of the backing plate 24 by an adhesive, diffusion bond, or electro-deposition. Removal of the rings 80a,b simply requires dissolving the adhesive with a solvent. While a plurality of rings 80a,b are shown, it should be understood that only a single one of the rings 80a or 80b can also be used in this target 20. Also, in the version shown, the rings 80a,b are shown as placed within the annular grooves 60a,b of the backing plate 24, and between the surface of the annular grooves 60a,b and the circular ridges 76a,b of the sputtering plate 26. However, the rings 80a,b can also be placed on a flat front surface 32 that is without grooves, or even placed on the mesas between the annular grooves 60a,b. The rings 80a,b reduce eddy currents that otherwise occur in the grooves 60a,b this region of a solid conventional backing plate 24 thereby also reducing excessive erosion of the sputtering plate 26 at these regions. To modify the eddy currents, the rings 80a,b are made of a different metal that the sputtering material or the backing plate material. In one example, when the sputtering plate 26 is made from aluminum, and the backing plate 24 is composed of aluminum, a suitable ring 80 is made from stainless steel. The ring 80 can be a circular ring with an inner diameter that is less than about 10 cm, for example, from about 10 cm to about 20 cm.

Figure 4:
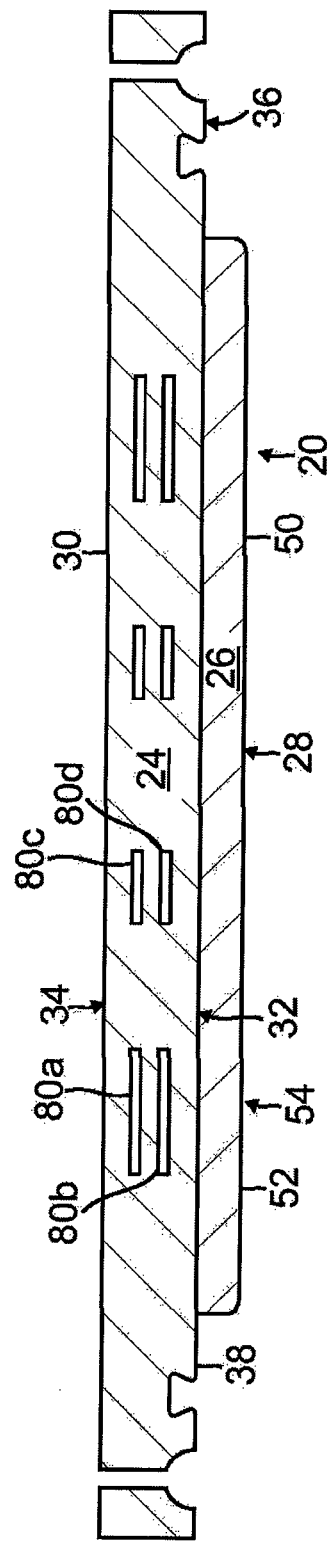
FIG. 4 is a sectional schematic side view of an embodiment of a target having a backing plate with a plurality of rings embedded in the backing plate.

In another version, a plurality of rings 80a-d composed of a different material than the backing plate 24 are embedded within the circular plate 30 of the backing plate 24 as shown in FIG. 4. The rings 80a-d can also comprise a plurality of annular layers of the same material or a different material. In this version, the rings 80a-d are placed inside the backing plate 24 itself. In this version, the plurality of rings 80a-d are mounted in two planes with each of the sets of rings 80a,b and 80c,d having a different inner diameter, so that the sets of rings are concentric to one another. In another version, a plurality of rings 80a-d are mounted in a single plane (not shown) with each annular ring having a different inner diameter, so that the rings are all concentric to one another.

In another version, the ring 80 can be shaped as a band 90 that has a height and a thickness wherein the height of the band 90 is greater than the thickness of the band 90, as shown in FIG. 5. The band 90 comprises a circular structure having an inner sidewall and an outer sidewall wherein the sidewalls are substantially vertical. The band 90 can be a monolithic structure or can comprise one or more strands of wire that are coiled to make a band-shaped coil. In one embodiment a groove is machined into the backing plate and the band 90 is then embedded therein. However other configurations are possible for example the band 90 can be partially embedded in the backing plate 24 and partially embedded in the sputtering plate 26 or the band 90 can be affixed to the backside surface of the backing plate 24 and extend vertically upwards from the backside surface of the backing plate 24. The eddy current within the band 90 is bounded by the band's geometry. Because the band 90 provides more material at a given radius, as compared to a more horizontal ring shape, the band 90 will have a lower resistance to current at a given radius. Consequently, an eddy current through the band 90 results in a magnetic field affect that is more concentrated about the radius of the band 90. This can be useful when the band 90 is used to modify a magnetic field that has large gradients in magnetic strength across the face of the target 20. In one version the ring 80 comprises a band 90 having a thickness of between about 0.1 cm and about 0.6 cm and a height of between about 0.5 cm and about 2.5 cm.

Figure 6B:
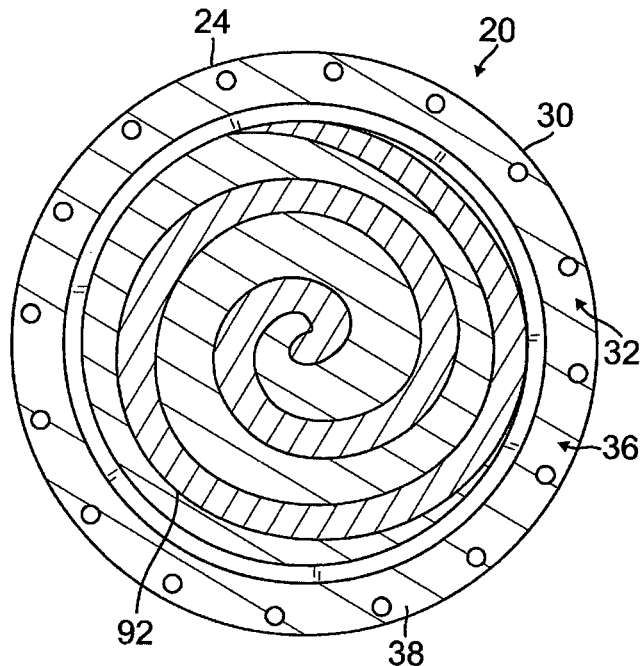

The ring 80 can also comprise a spiral-shaped plate 92 that is embedded in the backing plate 24 as shown in FIGS. 6A and 6B. The spiral-shaped plate 92 comprises a curved planar metal strip. The curved metal strip emanates from a central point 84, getting progressively farther away as it revolves around the point 84. In one version, described using polar coordinates, the radius r between the central point 84 and the radially inner edge of the metal strip can be described as a continuous monotonic function of angle θ. In the version shown, the central point 84 is located about the center of the backing plate 24. The spiral-shaped plate 92 can have a vertical thickness of between about 0.2 and about 0.6 cm and can be embedded in the backing plate 24, or partially embedded in the backing plate 24 and partially embedded in the sputtering plate 26 or the spiral-shaped plate 92 can be between the sputtering plate 26 and the backing plate 24, or even mounted to the backside surface of the backing plate 24. The spiral-shaped plate provides an electrically conductive pathway that can be shaped to vary in total length with respect to radius to compensate for the radially varying linear velocity of the rotating magnets that generate the magnetic field. Note that the linear velocity of the magnetic portion of each rotating magnet changes with the length of the circle traveled by the rotating magnet as it rotates. In one version the plate 92 comprises a vertical thickness of between about 0.1 cm and about 0.6 cm.

Figure 7B:
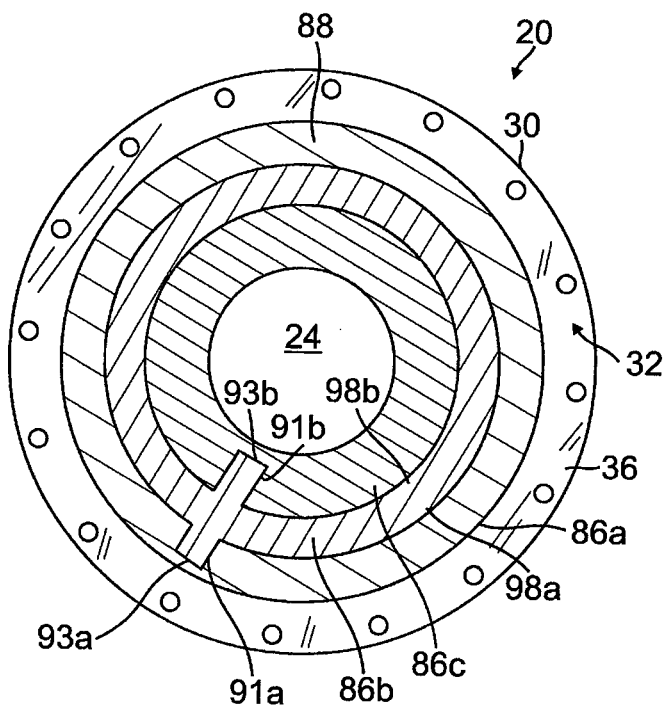

In another version the ring 80 is a composite ring 88 comprising a plurality of nesting rings 86 that are shaped and sized to fit within one another. For example, the plurality of nesting rings 86 can comprise three rings 86a-c that have an external profile shaped to fit together to form a composite ring 88, as shown for example in FIGS. 7A and 7B. The outer ring 86a comprises an annular ring having a radially inward ledge 96. The middle ring 86b comprises an annular ring having a peripheral flange 98a and a radially inward flange 98b. The inner ring 86c comprises an annular ring having a peripheral ledge 94. The peripheral ledge 94 of the inner ring 86c contacts the radially inward flange 98b of the middle ring 86b and the peripheral flange 98a of the middle ring 86b contacts the radially inward ledge 96 of the outer ring 86a. The rings 86a-c can be bonded to each other mechanically or by other means such as diffusion bonding.

In one embodiment the rings additionally comprise an alignment key 89. The alignment key 89 can comprise one or more teeth 91 and one or more grooves 93 for seating of the teeth 91 as shown for example in FIG. 7B. The middle ring 86b comprises an outwardly extending tooth 91a for seating in a groove 93a of the outer ring 86a. The middle ring 86b also comprises an inwardly extending tooth 91b for seating in an outer groove 93b of the inner ring 86c. The alignment key 89 allows for the rings 86a-c to be assembled in a particular orientation and prevents horizontal rotation of the rings 86 after assembly.

In one version the nesting rings 86a-c are assembled and bonded together to form a composite ring 88. The pre-bonded composite ring 88 can then be inserted into a groove in the backing plate 24 and fastened to the plate 24 by bonding, clamping or bolting. A prefabricated or pre-bonded composite ring 88 simplifies the fastening process because the composite ring assembly can be fastened to the backing plate 24 by one method or via one set of drilled screw holes rather than requiring independent fastening of each ring 86. Different configurations are also possible such as for example the nesting rings 86a-c can be partially embedded in the backing plate 24 and partially embedded in the sputtering plate 26 or the nesting rings 86a-c can be affixed to the backside surface of the backing plate 24 and extend vertically upwards from the backside surface of the backing plate 24. In one version, the composite ring 88 has a diameter of between about 20 and 30 cm and a thickness of between about 0.5 cm and about 1 cm.

The various configurations of the sputtering target 20 described herein control the electromagnetic properties of a sputtering target 20 by changing eddy current or even the magnetic permeability of the target 20. In doing so, the target 20 exhibits reduced erosion at its surface causing the erosion grooves that occur in conventional targets to be reduced in thickness. In addition, the sputtering target 20 has increased thicknesses of sputtering material at the locations of the erosion grooves, so that even if erosion grooves are formed, the target 20 can be continued to be used for a longer time period without sputtering through to the backing plate 24. In this manner, the present sputtering target embodiments provide enhanced life and usage time in sputtering chambers.

The sputtering targets 20 described herein are mounted in a sputtering apparatus 100 comprising a sputtering chamber 102 with enclosure walls 103. The sputtering target 20 is mounted to face a substrate 104 resting on a substrate support 106 in a process zone 108 as shown in FIG. 8. The chamber 100 can be a part of a multi-chamber platform (not shown) having a cluster of interconnected chambers connected by a substrate transfer mechanism, such as a robot arm, that transfers substrates 104 between the chambers 100. In the version shown, the process chamber 100 comprises a sputter deposition chamber, also known as a physical vapor deposition (PVD) chamber, which is capable of sputter depositing material such as for example, one or more of aluminum, copper, tantalum, titanium and tungsten or other materials, on a substrate 104.

The substrate support 106 comprises a pedestal 110 having a substrate receiving surface 112 with a plane substantially parallel to and facing a the sputtering surface 54 of the overhead sputtering target 20. The pedestal 110 may include an electrostatic chuck or a heater, such as an electrical resistance heater or heat exchanger. In operation, a substrate 104 is introduced into the chamber 100 through a substrate loading inlet (not shown) in the sidewall 114 of the chamber 100 and is placed on the substrate support 130. The support 110 can be lifted or lowered by support lift bellows and a lift finger assembly can be used to lift and lower the substrate 104 onto the support 110 during placement of a substrate 104. The pedestal 110 can be maintained at an electrically floating potential or grounded during plasma operation.

The chamber 100 further comprises a process kit 120 comprising various components that can be easily removed from the chamber 100, for example, to clean sputtering deposits off the component surfaces, replace or repair eroded components, and/or to adapt the chamber 100 for other processes. In one version, the process kit 120 comprises a shield 122 and a ring assembly 124. The shield 122 comprises a cylindrical band 128 having a diameter sized to encircle the sputtering surface 54 of the sputtering target 20 and the substrate support 106. The cylindrical band 128 terminates in a U-shaped channel 130 that surrounds the substrate support 106. The shield 122 also comprises a support ledge 132 that extends radially outward from the cylindrical band 214 to support the shield in the chamber 102. The entire shield 122 can be made from conducting materials such as 300 series stainless steel, or as in one version, aluminum. The shield can also be electrically grounded as shown. The ring assembly 124 is placed about the substrate support 106 and comprises a deposition ring 134 that is an annular band surrounding the support and a cover ring 136 that at least partially covers the deposition ring 134. The deposition ring 134 can be made from aluminum oxide and the cover ring 134 made from a material such as stainless steel, titanium or aluminum, or even a ceramic material, such as aluminum oxide.

The chamber 102 can further comprise a magnetic field generator 140 that generates a magnetic field 145 near the sputtering surface 54 of the target 20 to increase an ion density in a high-density plasma region adjacent to the target 20 to improve the sputtering of the target material. The magnetic field generator 140 comprises a plurality of rotatable magnets (not shown) which are positioned about the backside surface of the backing plate 24 of the target 20. The magnetic field generator 140 comprises a motor 144 mounted on an axle 146 which rotates the magnets. The magnetic field acts on the plasma and causes the energetic ions of the ionized gas to spiral along the field lines. By controlling the strength and shape of the magnetic field, the magnetic field assembly 140 can be used to control the flux of particles onto the surface of the target, and the uniformity with which the target is eroded away. A magnetic field generator 140 is described, for example, in U.S. Pat. No. 6,183,614 to Fu, entitled "Rotating Sputter Magnetron Assembly"; and U.S. Pat. No. 6,274,008 to Gopalraja et al., entitled "Integrated Process for Copper Via Filling," both of which are incorporated by reference herein in their entireties.

In operation, process gas is introduced into the chamber 102 through a gas supply 150 that includes process gas sources 152*a,b*, which are connected by conduits 154*a,b* having gas flow control valves 156*a,b*, such as mass flow controllers. The pressure in the chamber 102 is controlled by controlling the flow of gas to the chamber using the gas flow control valves 156*a,b*. The conduits 154*a,b* feed a gas distributor 158 which has at least one gas outlet 160 in the chamber. In one version, the gas outlet 160 is located about a periphery of the substrate 104. Typically, the pressure of the sputtering gas in the chamber 102 is several orders of magnitude below atmospheric levels.

The process gas is energized to process the substrate 104 by a gas energizer 160 that couples energy to the process gas in the process zone 108 of the chamber 102. For example, the gas energizer 154 may comprises process electrodes, that may be powered by a power supply to energize the process gas. The process electrodes may include an electrode that is or is in a wall, such as a sidewall 103, shield 120 or support 106 of the chamber 102, that may be capacitively coupled to another electrode, such as the target 20 above the substrate 104. The target 20 is electrically biased with respect to the other components to energize the process gas and sputters material from the target 20 onto the substrate 104 by a power supply 162. The resultant plasma formed in the zone 108 energetically impinges upon and bombards the sputtering surface 54 of the target 20 to sputter material off the surface onto the substrate 104.

Process gas is removed or exhausted from the chamber 102 through an exhaust system 170. The exhaust system 170 comprises an exhaust port 172 in the chamber 102 that is connected to an exhaust conduit 174 leading to an exhaust pump 176. In one version, the exhaust pump comprises a cryogenic pump having a pump inlet (not shown) that is designed to maintain a constant pumping speed for a given mass flow of process gas.

The chamber 100 is controlled by a controller 1800 that comprises program code having instruction sets to operate components of the chamber 100 to process substrates 104 in the chamber 100. For example, the controller 180 can comprise program code that includes substrate positioning instruction sets to operate the substrate support 106 and a substrate transfer mechanism; gas flow control instruction sets to operate gas flow control valves to set a flow of sputtering gas to the chamber 100; gas pressure control instruction sets to maintain a pressure in the chamber 100; gas energizer control instruction sets to operate the gas energizer 160 to set a gas energizing power level; magnetic field generator instruction sets to operate the magnetic field generator 140; temperature control instruction sets to control a temperature control system in the support or wall 114 to set temperatures of various components in the chamber 100; and process monitoring instruction sets to monitor the process in the chamber 100 via the process monitoring system 180.

Although exemplary embodiments of the present invention are shown and described, those of ordinary skill in the art may devise other embodiments which incorporate the present invention, and which are also within the scope of the present invention. For example, the ring 80 may be shaped and distributed differently to correspond to the magnetic field shape of other magnet systems. The backing plate 24 may comprise other materials or shapes than the exemplary ones described herein. For example, the sputtering target may be square or rectangular for the fabrication of display panels. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A sputtering target for a sputtering chamber, the sputtering target comprising:
   (a) a backing plate of a first material, the backing plate comprising a circular plate having a front surface and a back surface, the front surface comprising an annular groove that is shaped and sized to correspond to a predetermined region of higher target erosion relative to adjacent target area;
   (b) a sputtering plate of a second material comprising sputtering material that is different from the first material, the sputtering plate mounted on the backing plate, the sputtering plate comprising a disk comprising a sputtering surface and a backside surface having a circular ridge that is shaped and sized to fit into the annular groove, the circular ridge composed of the sputtering material; and
   (c) a ring of a third material that is different from the first and second materials, the ring resting in the annular groove without being attached to the groove.

2. A target according to claim 1 wherein the annular groove has an axis of symmetry about the center of the circular plate of the backing plate.

3. A target according to claim 1 wherein the annular groove comprises a circle that is symmetric about a center of the circular plate and spaced apart from the perimeter of the circular plate.

4. A target according to claim 3 wherein the annular groove comprises a depth of less than about 5 cm.

5. A target according to claim 3 wherein the annular groove comprises a depth of from about 0.3 cm to about 2 cm.

6. A target according to claim 3 wherein the width of the annular groove is from about 1 cm to about 7.5 cm.

7. A target according to claim 1 wherein the annular groove has an inner radius and an outer radius, and the difference between the inner and outer radius is from about 1 to about 5 cm.

8. A target according to claim 1 wherein the front surface of the backing plate comprises a plurality of annular grooves, and the backside surface of the sputtering plate comprises a plurality of circular ridges that are each shaped and sized to fit into one of the annular grooves of the backing plate.

9. A target according to claim 8 wherein the plurality of annular grooves are positioned concentric to one another and centered about the center of the sputtering plate.

10. A target according to claim 1 wherein the ring comprises a band or coil.

11. A target according to claim 1 comprising a plurality of rings.

12. A sputtering chamber comprising:
 (a) the sputtering target of claim 1;
 (b) a substrate support facing the sputtering target;
 (c) a magnetic field generator comprising a plurality of rotatable magnets positioned about the back surface of the backing plate;
 (d) a gas distributor to introduce a gas into the sputtering chamber; and
 (e) a gas exhaust port to exhaust gas from the sputtering chamber.

13. A method of extending the life of a sputtering target comprising a sputtering plate mounted on a backing plate, the method comprising:
 (a) forming a backing plate of a first material;
 (b) forming an annular groove in a surface of the backing plate such that the annular groove is shaped and sized to correspond to a predetermined region of higher target erosion relative to adjacent target area;
 (c) forming a ring of a third material;
 (d) positioning the ring in the annular groove such that the ring rests in the annular groove without being attached to the groove; and
 (e) filling the annular groove with a second material which is a sputtering material,
 wherein the first, second and third materials are different from one another.

14. A method according to claim 13 comprising forming an annular groove that is shaped and sized to correspond to an observed region of higher target erosion relative to an adjacent area of the sputtering plate.

15. A method according to claim 13 wherein the backing plate comprises a circular plate having a center, and comprising forming an annular groove having an axis of symmetry about the center of the circular plate of the backing plate.

16. A method according to claim 13 comprising forming an annular groove comprising a circle that is symmetric about a center of the backing plate.

17. A method according to claim 13 comprising:
 (i) forming a plurality of annular grooves on the front surface of the backing plate; and
 (ii) forming on the backside surface of the sputtering plate, a plurality of circular ridges that are each shaped and sized to fit into an annular groove of the backing plate.

18. A method according to claim 17 comprising forming a plurality of annular grooves that are positioned concentric to one another and centered about the center of the sputtering plate.

19. A sputtering target for a magnetron sputtering chamber, the sputtering target comprising:
 (a) a backing plate comprising a circular plate comprising a paramagnetic first material, the circular plate having a front surface and a back surface, the front surface comprising an annular groove that is shaped and sized to correspond to a predetermined region of higher target erosion relative to adjacent target area;
 (b) a sputtering plate mounted on the front surface of backing plate, the sputtering plate comprising a disk comprising a sputtering surface of second material comprising sputtering material, and the disk comprising a backside surface having a circular ridge that is shaped and sized to fit into the annular groove, the circular ridge composed of the sputtering material; and
 (c) a ring resting in the annular groove without being attached to the groove, the ring comprising a ferromagnetic third material capable of increasing the eddy current in the plate, thereby creating a net lower magnetic field about the sputtering plate,
 wherein the first, second, and third materials are different materials.

20. A target according to claim 19 further comprising a plurality of rings.

21. A target according to claim 19 wherein the ring is a band or coil.

22. A target according to claim 19 wherein the ring has an inner diameter of from about 10 to about 15 (cm).

23. A target according to claim 19 wherein the first material comprises at least one of copper, chromium, stainless steel and aluminum; and the sputtering material comprises at least one of aluminum, copper, tungsten, titanium, cobalt, nickel and tantalum.

24. A target according to claim 19 wherein the first material comprises CuCr alloy and the sputtering material comprises aluminum.

25. A method of controlling the electromagnetic properties of a sputtering target of a magnetron sputtering chamber, the sputtering target comprising a sputtering plate mounted on a backing plate, the method comprising:
 (a) providing a backing plate comprising a paramagnetic first material;
 (b) forming an annular groove in a surface of the backing plate such that the annular groove is shaped and sized to correspond to a predetermined region of higher target erosion relative to adjacent target area;
 (c) providing a ring in the annular groove to rest in the annular groove without being attached to the groove, the ring comprising a ferromagnetic second material having different electromagnetic properties than the first material; and
 (d) forming a sputtering plate comprising a backside surface having a circular ridge composed of sputtering material within the annular groove, the sputtering plate comprising a third material,
 wherein the first, second and third materials are different from one another.

26. A sputtering target for a magnetron sputtering chamber, the sputtering target comprising:
 (a) a backing plate comprising a circular plate composed of a paramagnetic first material, the circular plate having an annular groove that is shaped and sized to correspond to a predetermined region of higher target erosion relative to adjacent target area;
 (b) a sputtering plate mounted on the backing plate, the sputtering plate comprising a disk comprising a second material composed of sputtering material, the disk having a backside surface with a circular ridge that is shaped and sized to fit into the annular groove, and the circular ridge composed of the sputtering material; and (c) a ring comprising a ferromagnetic third material embedded within the circular plate to rest in the annular groove without being attached to the groove, wherein the ring increases the eddy current in the backing plate thereby creating a net lower magnetic field about the sputtering plate, and wherein the first, second, and third materials are different materials.

27. A target according to claim 26 wherein the ring is embedded in a thickness of the circular plate.

28. A target according to claim 26 further comprising a plurality of rings.

29. A target according to claim 28 wherein the ring is mounted to a back surface of the disk of the sputtering plate.

30. A target according to claim 26 wherein the first material comprises at least one of copper, chromium, stainless steel and aluminum; the second material comprises at least one of aluminum, copper, tungsten, titanium, cobalt, nickel and tantalum; and the third material comprises at least one of nickel, stainless steel and aluminum.

31. A target according to claim 26 wherein the ring comprises a band.

32. A target according to claim 26 wherein the ring comprises a spiral-shaped plate.

33. A target according to claim 26 wherein the ring comprises a plurality of nesting rings.

34. A target according to claim 33 wherein the plurality of nesting rings are bonded together to form a composite ring.

35. A target according to claim 33 wherein the nesting rings comprise an alignment key.

* * * * *